United States Patent
Fujihara

(10) Patent No.: US 8,394,720 B2
(45) Date of Patent: Mar. 12, 2013

(54) PLASMA PROCESSING METHOD AND RESIST PATTERN MODIFYING METHOD

(75) Inventor: Jin Fujihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 694 days.

(21) Appl. No.: 12/553,611

(22) Filed: Sep. 3, 2009

(65) Prior Publication Data

US 2010/0055911 A1 Mar. 4, 2010

Related U.S. Application Data

(60) Provisional application No. 61/107,065, filed on Oct. 21, 2008.

(30) Foreign Application Priority Data

Sep. 4, 2008 (JP) .................................. 2008-226949

(51) Int. Cl.
*H01L 21/311* (2006.01)

(52) U.S. Cl. ........ 438/694; 438/524; 438/695; 438/705; 438/706; 438/714; 156/345.47; 430/296; 430/297; 430/311; 430/313; 430/328

(58) Field of Classification Search .............. 216/37, 216/41; 257/751; 430/296, 311, 313, 326, 430/328, 5; 438/694, 695, 705, 706, 714, 438/725

See application file for complete search history.

(56) References Cited

U.S. PATENT DOCUMENTS

| 2005/0048787 | A1 | 3/2005 | Negishi et al. |
| 2007/0165355 | A1 | 7/2007 | Sato et al. |
| 2007/0227666 | A1* | 10/2007 | Matsumoto et al. ..... 156/345.47 |

FOREIGN PATENT DOCUMENTS

| CN | 1992164 A | 7/2007 |
| JP | 2003-249431 A | 9/2003 |
| JP | 2004-31944 | 1/2004 |
| JP | 2005-72518 A | 3/2005 |
| JP | 2005-535936 A | 11/2005 |
| JP | 2006-270018 A | 10/2006 |

OTHER PUBLICATIONS

Chinese Office Action issued Feb. 22, 2012, in Patent Application No. 200910171072.1 (with English-language translation).
Chinese Office Action issued on Nov. 11, 2010 in corresponding Chinese Application No. 200910171072.1 (with an English Translation).

* cited by examiner

*Primary Examiner* — Duy Deo
*Assistant Examiner* — Erin Bergner
(74) *Attorney, Agent, or Firm* — Rothwell, Figg, Ernst & Manbeck, P.C.

(57) ABSTRACT

A plasma processing method includes modifying a resist pattern of the substrate; and trimming the modified resist pattern through a plasma etching. The modifying includes: supplying the processing gas for modification from the processing gas supply unit to the inside of the processing chamber while the substrate having a surface on which the resist pattern is formed is mounted on the lower electrode; supplying the high frequency power from the high frequency power supply to generate a plasma of the processing gas for modification; and supplying the negative DC voltage from the DC power supply to the upper electrode.

19 Claims, 13 Drawing Sheets

INITIAL

No. 3 (DC: HF=200W)

No. 4 (DC: LF=250W)

No. 5 (DC: 10M Torr)

PLASMA PROCESSING METHOD AND RESIST PATTERN MODIFYING METHOD

CROSS-REFERENCE TO RELATED APPLICATIONS

This application claims priority to Japanese Patent Application No. 2008-226949 filed on Sep. 4, 2008, the entire contents of which are hereby incorporated by reference.

1. Field of the Invention

The present invention relates to a plasma processing method that trims a fine resist pattern through plasma etching and a resist pattern modifying method that modifies an etched resist pattern before the trimming.

2. Background of the Invention

In a manufacturing process of semiconductor devices, a photoresist pattern is formed on a target substrate, i.e., a semiconductor wafer through a photolithography process and etching is performed by using the photoresist pattern as a mask.

Recently, the semiconductor devices have been getting smaller and this trend requires much finer performance in etching processes. To meet such demands for miniaturization, a film thickness of photoresist used as a mask has been getting thinner and the used photoresists are changed from KrF resists (i.e., photoresists exposed by a laser beam employing KrF gas) to ArF resists (i.e., photoresists to be exposed by a laser beam of shorter wavelengths (193 nm) employing ArF gas) as a light emitting source capable of providing a pattern opening of about 0.13 μm or less.

In the photolithography technology, an available minimum dimension is inherently determined. Accordingly, there has been suggested a technique that trims a resist pattern through isotropic etching in order to form pattern widths that are smaller than the available minimum dimension (see, e.g., Japanese Patent Laid-open Application No. 2004-031944, etc.).

However, when a fine resist pattern is formed by the trimming, pattern collapse may occur after the trimming. Especially, the ArF resist, which is originally used to form a fine pattern, has a low strength. Therefore, pattern collapse may occur easily when a resist pattern is formed by using the ArF resist. Moreover, since a vertical etched amount is substantial in the trimming, the thickness of the remaining resist becomes smaller.

SUMMARY OF THE INVENTION

In view of the above, the present invention provides a plasma processing method, which can prevent a pattern from collapsing in trimming of a resist pattern and decrease a longitudinally etched amount, and a resist pattern modifying method that modifies an etched resist pattern before the trimming. Further, the present invention provides a storage medium storing a program for executing the resist pattern modifying method.

In accordance with an aspect of the present invention, there is provided a plasma processing method for use with a plasma processing apparatus, which includes: a processing chamber configured to accommodate a target substrate therein and capable of exhausting its inside to vacuum; a lower electrode arranged in the processing chamber and serving as a mounting table for the substrate; an upper electrode arranged in the processing chamber to face the lower electrode; a processing gas supply unit configured to supply a processing gas to the inside of the processing chamber; a high frequency power supply configured to supply a high frequency power to at least one of the upper electrode and the lower electrode to generate a plasma; and a DC power supply configured to supply a negative DC voltage to the upper electrode. The method includes modifying a resist pattern of the substrate; and trimming the modified resist pattern through a plasma etching. The modifying includes: supplying the processing gas for modification from the processing gas supply unit to the inside of the processing chamber while the substrate having a surface on which the resist pattern is formed is mounted on the lower electrode; supplying the high frequency power from the high frequency power supply to generate a plasma of the processing gas for modification; and supplying the negative DC voltage from the DC power supply to the upper electrode.

In accordance with another aspect of the present invention, there is provided a resist pattern modifying method for use with a plasma processing apparatus, which includes: a processing chamber configured to accommodate a target substrate therein and capable of exhausting its inside to vacuum; a lower electrode arranged in the processing chamber and serving as a mounting table for the substrate; an upper electrode arranged in the processing chamber to face the lower electrode; a processing gas supply unit configured to supply a processing gas to the inside of the processing chamber; a high frequency power supply configured to supply a high frequency power to at least one of the upper electrode and the lower electrode to generate a plasma; and a DC power supply configured to supply a negative DC voltage to the upper electrode. The method includes modifying a resist pattern of the substrate, where the modifying is carried out prior to trimming the resist pattern through a plasma etching. The modifying includes: supplying the processing gas for modification from the processing gas supply unit to the inside of the processing chamber while the substrate having a surface on which the resist pattern is formed is mounted on the lower electrode; supplying the high frequency power from the high frequency power supply to generate a plasma of the processing gas for modification; and supplying the negative DC voltage from the DC power supply to the upper electrode.

In accordance with still another aspect of the present invention, there is provided a computer-readable storage medium storing a computer-executable program for controlling a plasma processing apparatus, the program being executed to carry out the resist pattern modifying method.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

An embodiment of the present invention will be now described with reference to the accompanying drawings which form a part hereof.

Figure 1:
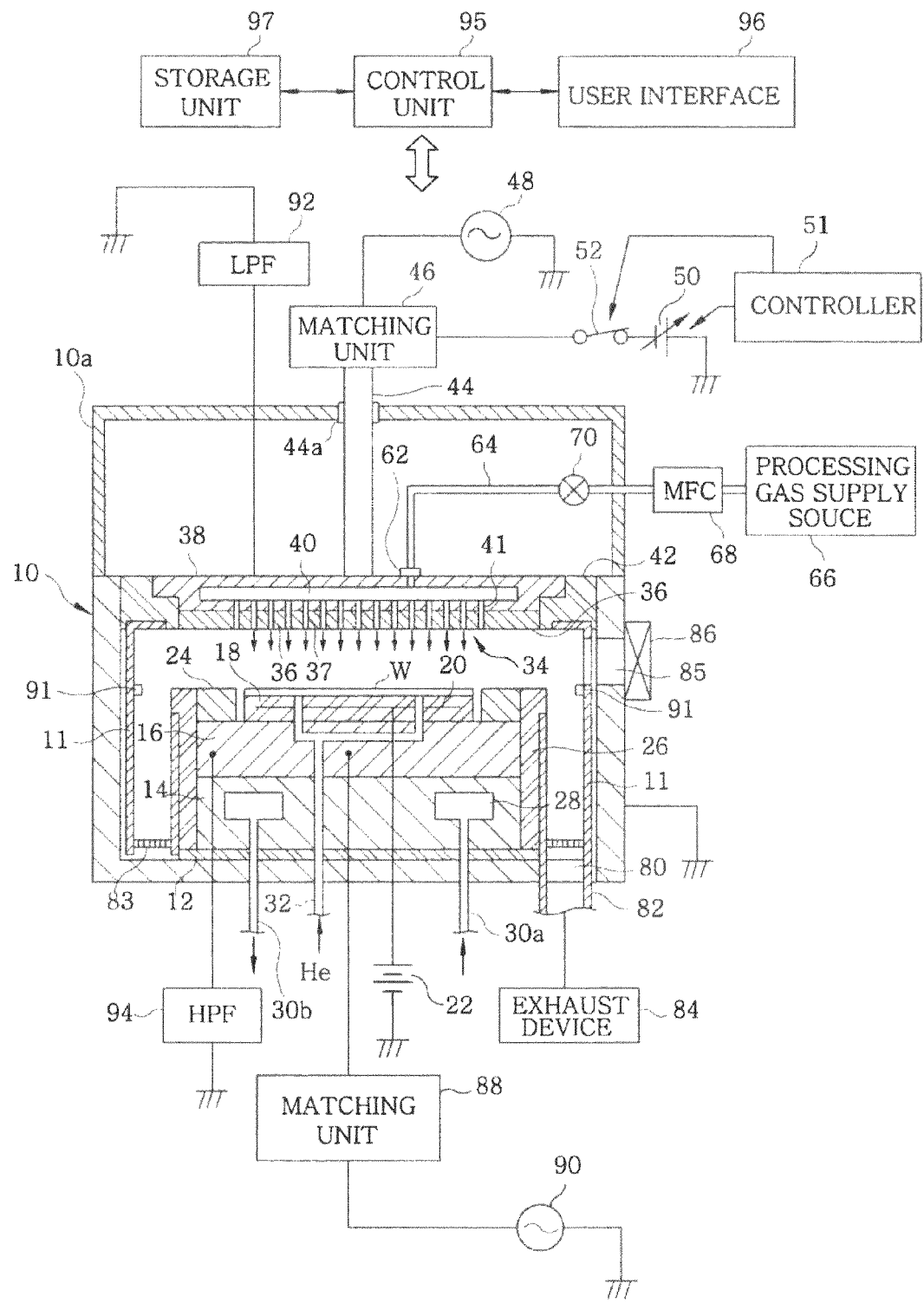
FIG. 1 is a schematic cross sectional view showing a plasma etching apparatus in accordance with an embodiment of the present invention.

FIG. 1 is a schematic cross sectional view showing an example of a plasma etching apparatus in accordance with the embodiment of the present invention.

The plasma etching apparatus, which is a capacitively coupled parallel plate type etching apparatus, includes a substantially cylindrical chamber (processing chamber) 10, the surface of which is, e.g., anodically oxidized aluminum. The chamber is frame-grounded.

A cylindrical susceptor support 14 is placed on a bottom portion of the chamber 10 via an insulating plate 12 made of ceramic or the like and a susceptor 16 made of, e.g., aluminum is placed on the susceptor support 14. The susceptor 16 serves as a lower electrode and a target substrate, i.e., a semiconductor wafer W, is mounted on the susceptor 16.

On an upper surface of the susceptor 16, there is provided an electrostatic chuck 18 attracting and holding the wafer W by an electrostatic force. In the electrostatic chuck 18, an electrode 20 made of a conductive film is placed between a pair of insulating layers or insulating sheets. A DC power supply 22 is electrically connected to the electrode 20. The wafer W is attracted to and held by the electrostatic chuck 18 by the electrostatic force such as a Coulomb force or the like generated by a direct current voltage supplied from the DC power supply 22.

At a peripheral portion of the electrostatic chuck 18 and wafer W on the upper surface of the susceptor 16, a conductive focus ring (correcting ring) 24 made of, e.g., silicon is placed to improve the etching uniformity. A cylindrical inner wall member 26 made of, e.g., quartz is placed at a side portion of the susceptor 16 and the susceptor support 14.

A coolant chamber 28 having, e.g., an annular shape is placed inside the susceptor support 14. A coolant, e.g., a cooling water, of a predetermined temperature is circulated and supplied from a chiller unit (not shown) provided in an outside of the coolant chamber 28 via pipelines 30a and 30b. It is possible to control a process temperature of the wafer W on the susceptor 16 by adjusting the temperature of the coolant.

Next, a heat transfer gas, e.g., He gas, is supplied from a heat transfer gas supply unit (not shown), via a gas supply line 32, to a space between an upper surface of the electrostatic chuck 18 and a back surface of the wafer W.

An upper electrode 34 is placed above the lower electrode, i.e., the susceptor 16 in parallel with the susceptor 16. A space between the upper electrode 34 and the lower electrode 16 is a plasma generation space. The upper electrode 34 provides a surface that makes in contact with the plasma generation space while facing the wafer W on the lower electrode, i.e., the susceptor 16.

The upper electrode 34 is supported by an insulating shield member 42 at an upper portion of the chamber 10. The upper electrode 34 includes an electrode plate 36 having a plurality of gas injection openings 37, which is placed on the facing surface facing the susceptor 16, and an electrode holder 38 having a water cooling structure formed of a conductive material, e.g., aluminum, the surface of which is anodically oxidized. The electrode holder 38 detachably holds the electrode plate 36. The electrode plate 36 may be made of a semiconductor or a conductor of low resistance having small Joule heat. The electrode plate 36 may also be made of a silicon-containing material to enhance the resist. As a result, the electrode plate 36 may be preferably made of silicon or silicon carbide (SiC). A gas diffusion space 40 is provided inside the electrode holder 38. A plurality of gas through holes 41 communicating with the gas injection openings 37 extends downwardly from the gas diffusion space 40.

At the electrode holder 38, a gas inlet port 62 is formed to supply processing gas to the gas diffusion space 40. A gas supply line 64 is connected to the gas inlet port 62 and a processing gas supply source 66 is connected to the gas supply line 64. On the gas supply line 64, a mass flow controller (MFC) 68 and an opening valve 70 are placed in that order from the upstream side thereof, wherein a flow control system (FCS) may be employed instead of the MFC. Processing gases for quality modification and trimming of a resist pattern are supplied from the processing gas supply source 66. Fluorocarbon gas such as CF4 may be used as the processing gas for the modification of a resist pattern. Further, the processing gas may include other gas, i.e., inert gas such as Ar or the like. $N_2$, $O_2$, and/or a fluorocarbon gas may be employed as the processing gas for the trimming, for example. The processing gas flows from the processing gas supply source 66, via the gas supply line 64, to the gas diffusion space 40. Then, the processing gas flows through the gas through holes 41 and the gas injection openings 37 and is discharged to the plasma generation space in a shower form. Here, the upper electrode 34 functions as a shower head for supplying the processing gases.

A first high frequency power supply 48 is electrically connected to the upper electrode 34 via a matching unit 46 and the power feed rod 44. The first high frequency power supply 48 outputs a high frequency power of 10 MHz or higher, e.g., 60 MHz. The matching unit 46 matches the load impedance to the inner (or output) impedance of the first high frequency power supply 48. When a plasma is generated inside the chamber 10, the matching unit 46 functions such that the load impedance appears to be identical to the output impedance of the first high frequency power supply 48. An output terminal of the matching unit 46 is connected to an upper end portion of the power feed rod 44.

A variable DC power supply 50 is electrically connected to the upper electrode 34, in addition to the first high frequency power supply 48. The variable DC power supply 50 may be a bipolar power supply. In detail, the variable DC power supply 50 is connected, via the matching unit 46 and the power feed rod 44, to the upper electrode 34 and on and off of the power feeding can be operated by an on/off switch 52. The current, voltage, and polarity of the variable DC power supply 50 and the on and off of the on/off switch 52 is controlled by a controller 51.

Figure 2:
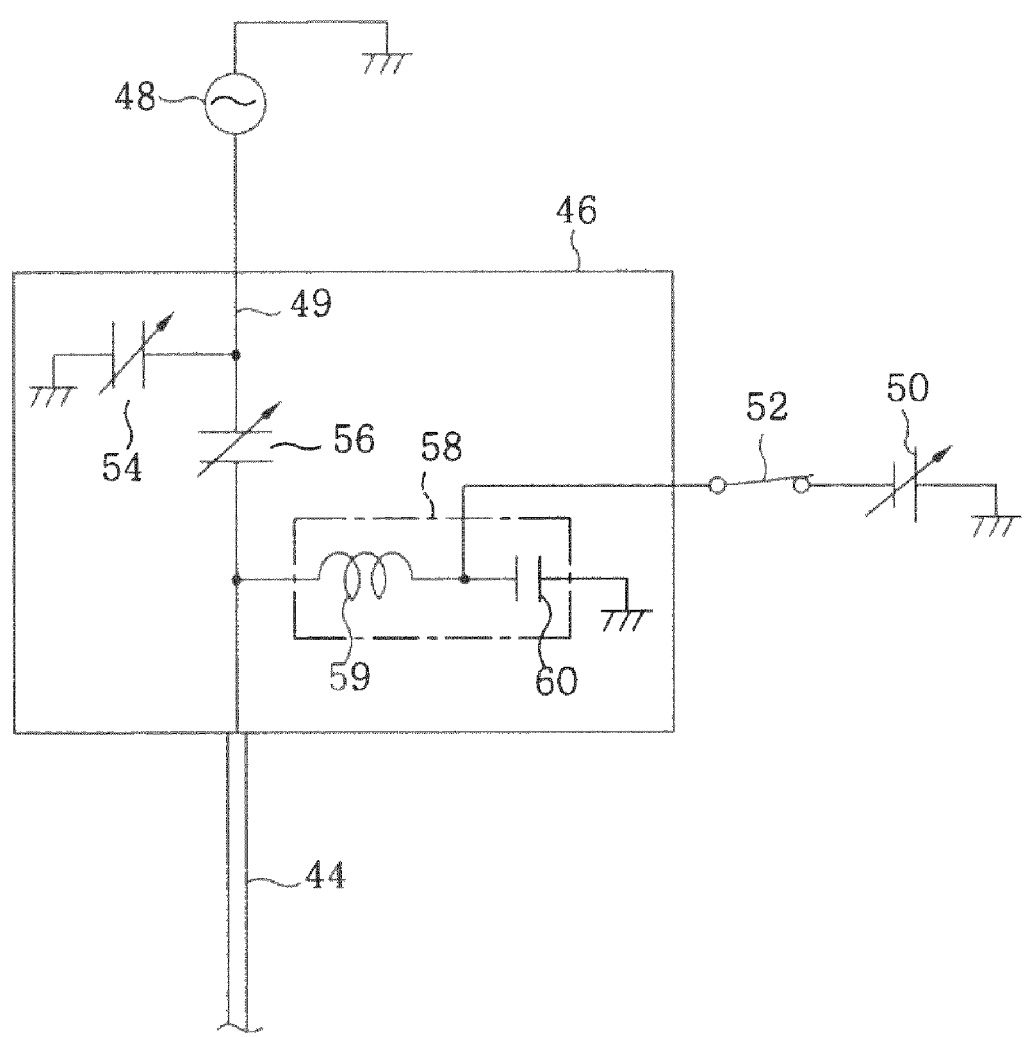
FIG. 2 shows a structure of a matching unit connected to a first high frequency power supply in the plasma etching apparatus shown in FIG. 1.

As shown in FIG. 2, the matching unit 46 includes a first variable capacitor 54 and a second variable capacitor 56, which are used to perform the above functions. The first variable capacitor 54 is placed in a line branched from a power feed line 49 of the first high frequency power supply 48 and the second variable capacitor 56 is placed at a downstream side of a branch point of the branched line in which the first variable capacitor 54 is placed. The matching unit 46 further includes a filter 58 trapping high frequency powers supplied from the first high frequency power source 48 and a second high frequency power source 90 which will be described below such that a DC voltage and a current can be effectively supplied to the upper electrode 34. In other words, a DC current flows from the variable DC power supply 50 to the power feed line 49 via the filter 58. The filter 58 includes a coil 59 and a capacitor 60. The coil 59 and the capacitor 60 are used to trap the high frequency powers supplied from the first and the second high frequency power supply 48 and 90.

A cylindrical ground conductor member 10a extends from a sidewall of the chamber 10 above the upper electrode 34. A top wall portion of the cylindrical ground conductor member 10a is electrically insulated from an upper portion of power feed rod 44 by a barrel-shaped insulating member 44a.

The second high frequency power supply 90 is electrically connected, via a matching unit 88, to the lower electrode, i.e., the susceptor 16. Ions are attracted to a wafer W by a high frequency power supplied from the second high frequency power supply 90 to the lower electrode, i.e., the susceptor 16. The second high frequency power supply 90 outputs the power of a frequency of 800 KHz or higher, e.g., 13 MHz. The matching unit 88 matches the load impedance to the inner (or output) impedance of the second high frequency power supply 90. When a plasma is generated inside the chamber 10, the matching unit 88 functions such that the load impedance appears to be the same as the inner impedance of the second high frequency power supply 90.

A low pass filter (LPF) 92 is electrically connected to the upper electrode 34 to prevent the high frequency power supplied from the first high frequency power supply 48 from passing through the low pass filter 92 itself and to allow the high frequency power supplied from the second high frequency power supply 90 to pass through the low pass filter 92 itself and reach the ground. The low pass filter 92 may be preferably an LR filter or an LC filter. However, it may be sufficient to employ only one conducting wire, since just a single conducting wire can provide a high enough reactance for the high frequency power supplied from the first high frequency power supply 48. In contrast, a high pass filter (HPF) 94 is electrically connected to the lower electrode, i.e., the susceptor 16 in order to allow the high frequency power supplied from the first high frequency power supply 48 to pass through the high pass filter 94 itself and reach the ground.

An exhaust port 80 is placed on a bottom portion of the chamber 10. An exhaust device 84 is connected to the exhaust port 80 via an exhaust line 82. The exhaust device 84, which includes a vacuum pump such as a turbo molecular pump or the like, can lower the pressure inside the chamber 10 to a predetermined level. Moreover, a loading/unloading port 85 for a wafer W is provided at the sidewall of the chamber 10. The loading/unloading port 85 is opened and closed by a gate valve 86. A deposition shield 11 is detachably provided along an inner wall of the chamber 10 to prevent the attachment of etching byproducts (depositions). In other words, the deposition shield 11 serves as the inner surface of the wall of the chamber 10. The deposition shield 11 is also provided along an outer periphery of the inner wall member 26. At a bottom portion of the chamber 10, an exhaust plate 83 is provided between the deposition shield 11 as the inner wall of the chamber 10 and the deposition shield 11 on the inner wall member 26. The deposition shield 11 and the exhaust plate 83 may be preferably made of an aluminum material coated with a ceramic such as $Y_2O_3$ or like.

A conductive member (GND block) 91 DC-wisely connected to the ground is provided on the deposition shield 11 on the inner wall of the chamber 10, at a height that is substantially identical to that of the wafer W. The conductive member (GND block) 91 serves to prevent an abnormal discharge when the plasma is generated.

Parts of the plasma processing apparatus are connected to a control unit (general control device) 95 and controlled thereby. Moreover, a user interface 96 is connected to the control unit 95. The user interface 96 includes a keyboard by which an operation manger input commands to manage the plasma processing apparatus and a display for visualizing and displaying an operation status of the plasma processing apparatus.

A storage unit 97 is also connected to the control unit 95. The storage unit 97 stores a control program for executing various kinds of processing in the plasma processing apparatus under the control of the control unit 95 and a recipe, i.e., a program for executing the processing of the parts of the plasma processing apparatus depending on processing conditions. The recipe may be stored in a hard disk or a semiconductor memory. Alternatively, the recipe may be stored in a portable computer-readable storage medium such as CDROM, DVD, or the like. In this case, the recipe is set at a predetermined position of the storage unit 97.

Moreover, in the plasma processing apparatus, desired processing is performed under the control of the control unit 95 by retrieving and executing a recipe from the storage unit 97 in accordance with an instruction or the like received from the user interface 96.

Figure 3A:
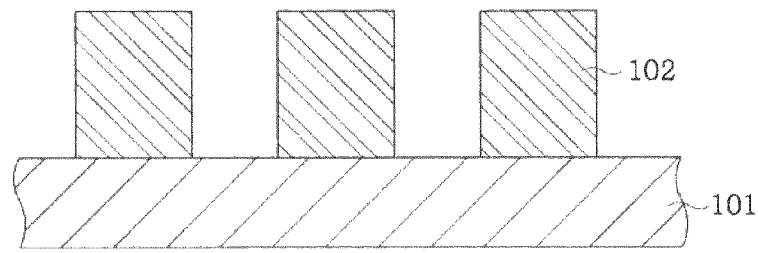
FIGS. 3A to 3C are cross sectional views showing processes of a trimming method in accordance with the embodiment of the present invention.
Figure 3B:
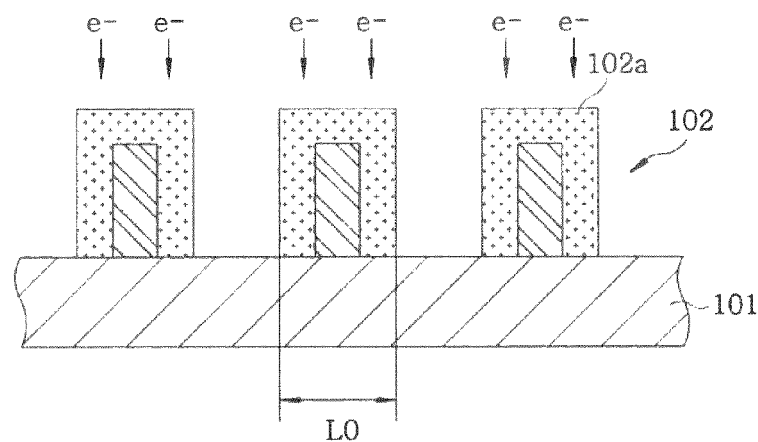
Figure 3C:
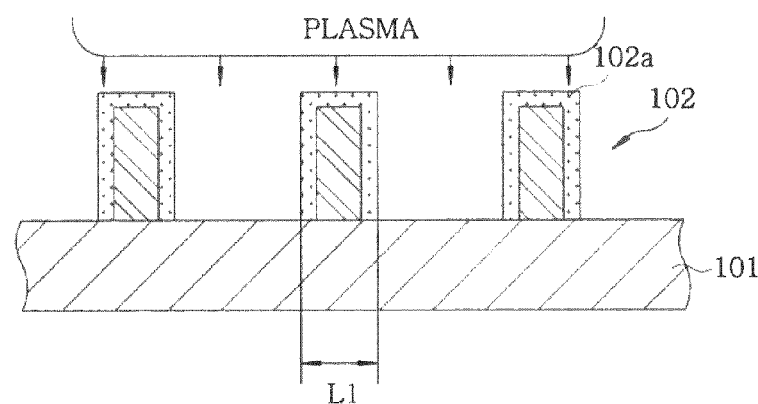
Figure 4:
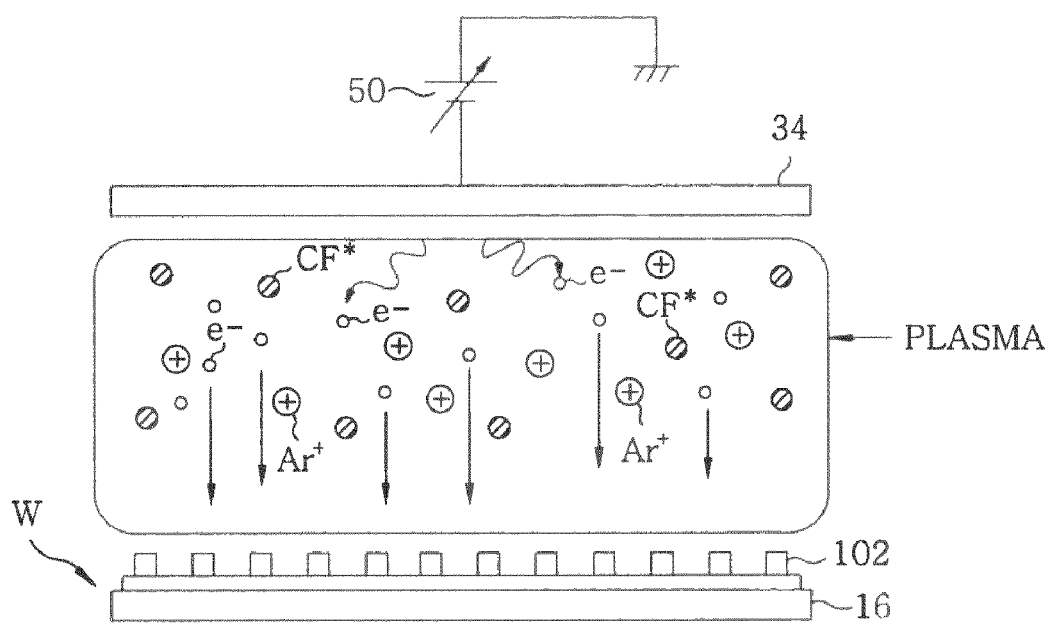
FIG. 4 is a schematic view showing a principle of modification and enhancement of a resist pattern.

A method of trimming a resist pattern by using the plasma etching apparatus described above in accordance with the embodiment of the present invention will be described with reference to the process cross sectional views of FIGS. 3A to 3C and the view of FIG. 4 showing the principle of the process.

In the trimming, the dimension of the resist pattern formed on an etching target film by the photolithography becomes decreased by plasma-etching the resist pattern. However, if the pattern size is very fine, the pattern that has become thinner by the trimming may collapse. Accordingly, the trimming process of the resist pattern is performed after the quality of the resist pattern is modified and enhanced in accordance with the embodiment of the present invention.

For the trimming process of a resist pattern, a wafer W in which a resist pattern 102 patterned by the photolithography process is formed on a film 101 is employed.

In processes of modifying and enhancing the resist pattern 102, the gate valve 86 is opened first and the wafer W having such a structure is loaded into the chamber 10 via the loading/unloading port 85. Then, the wafer W is mounted on the susceptor 16. A processing gas for modifying the resist pattern 102 is supplied at a predetermined flow rate from the processing gas supply source 66 to the gas diffusion space 40 and then the processing gas is supplied to the chamber 10 through the gas through holes 41 and the gas injection openings 37, during which the chamber 10 is exhausted by the exhaust device 84. The pressure of the chamber 10 is set to be a value between, e.g., 10 and 800 mTorr (1.33~106.4 Pa). The temperature of the susceptor 16 is set at a temperature between about 0 and 80° C.

Under such conditions, the processing gas for modifying the resist pattern 102 is continuously supplied from the processing gas supply source 66 to the chamber 10. A fluorocarbon gas such as CF4 may be used as the processing gas for modifying the resist pattern 102. Alternatively, the processing gas may include another gas, e.g., nonreactive gas such as Ar or the like.

In the state where the processing gas for the modification is supplied to the chamber 10, a high frequency power for generating plasma is supplied at a predetermined level from the first high frequency power supply 48 to the upper electrode 34 and a high frequency power for attracting ions is supplied at a predetermined level from the second high frequency power supply 90 to the lower electrode, i.e., the susceptor 16. A DC voltage is also supplied from the variable DC power supply 50 to the upper electrode 34. Moreover, the wafer W is attracted to and held by the susceptor 16 by supplying a DC voltage from the DC power supply 22 to the electrode 20 of the electrostatic chuck 18.

The processing gas discharged from the gas injection openings 37 formed at the electrode plate 36 of the upper electrode 34 is converted to a plasma by glow discharge, generated by the high frequency power, between the upper electrode 34 and the lower electrode, i.e., the susceptor 16. In the present embodiment, when the plasma is generated as such, a negative DC voltage of a predetermined level is supplied from the variable DC power supply 50 to the upper electrode 34. Electrons thus generated are injected into the resist pattern 102 and thus a portion injected with the electrons is modified. Accordingly, a modified layer 102a is formed, thereby enhancing the resist pattern 102 (FIG. 3B).

A mechanism of the above reaction will be described with reference to the view of FIG. 4. When the plasma is generated, electrons are produced around the upper electrode 34. If a negative DC voltage is supplied from the variable DC power supply 50 to the upper electrode 34, the electrons are accelerated downward, by the potential difference between the supplied DC voltage and the potential plasma in a vertical direction of a processing space to thereby be injected into the resist pattern 102 on the wafer W. As a result, the portion of the resist pattern 102 injected with the electrons is modified, thereby forming the modified layer 102a. The modified layer 102a is formed by removal of groups having low etching resistance, a cross-linking reaction and restructuring caused by the cleavage of double bonds as the electrons are injected. Such modification makes it possible to enhance the resist pattern 102 and increase the plasma resistance.

If the resist pattern 102 is formed of an ArF resist, a chemical structure of the ArF resist may be represented by the following structural formula 1:

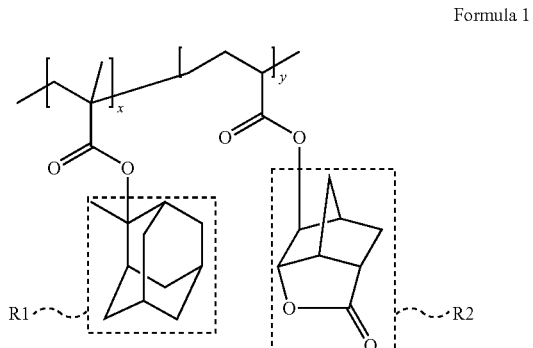

Formula 1

When the electrons are injected onto a resist pattern of the ArF as described above, following four reactions are considered to take place sequentially.

As a first stage, Reaction 1 takes place in which the chemical structure represented by the structural formula 1 is changed into a chemical structure represented by the following structural formula 2 by reducing oxygen atoms from a Lactone group R2 of the structural formula 1:

Formula 2

As a second stage, Reaction 2 takes place in which the chemical structure represented by the structural formula 2 is changed into a chemical structure represented by the following structural formula 3 by releasing the Lactone group R2 itself:

Formula 3

As a third stage, Reaction 3 takes place in which the chemical structure represented by the structural formula 3 is changed into a chemical structure represented by the following structural formula 4 by releasing the Adamantyl group:

Formula 4

As a fourth stage, Reaction 4 takes place in which the restructuring and the cross-linking reaction is promoted by the cleavage of a C=O part. By the Reaction 4, the chemical structure represented by the structural formula 4 is changed into a chemical structure represented by the following structural formula 5 and approaches to a chemical structure of graphite. As a result, the resist pattern is enhanced and the etching resistance of plasma is increased:

Formula 5

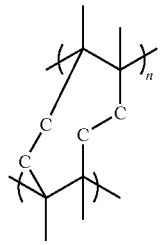

A degree of modification and a depth of the modified layer 102a can be controlled through a processing time, a value of current and voltage values supplied from the variable DC power source 50 and the like. Accordingly, these control parameters may be preferably controlled by the controller 51.

To form the modified layer 102a, a value of a voltage supplied from the variable DC power supply 50 to the upper electrode 34 is an important factor. The larger a magnitude of the voltage value is, the more a depth of the modified layer 102a is increased and its effect is enhanced. If a resist pattern has a depth (height) of about 150 nm, it is possible to modify its whole part by using a voltage of about −1500 V. Accordingly, it is sufficient to employ a voltage of about −1500 V. Moreover, since modification effect can be brought about by supplying a small amount of DC voltage, there is no lower limit of the voltage in particular. Accordingly, a voltage less than 0 V but not less than −1500 V may be supplied. If a resist film becomes thick and a pattern is widened, the magnitude of the voltage required to modify the whole part needs to be increased. Therefore, there is no upper limit of the voltage value in particular. However, a particularly allowable range is from about −400 to −2000 V become an actually, considering conditions of the apparatus.

The modified layer 102a needs to be thick enough to survive in a following trimming process. For example, when represented by using L0 and L1 shown in FIGS. 3B and 3C, the thickness of the modified layer 102a needs to be greater than (L0−L1)/2. If the modified layer 102a is totally wiped out in the trimming process, it is difficult to prevent pattern collapse.

As such, the process of modifying and enhancing the resist pattern 102 is completed. Thereafter, while the wafer W is held inside the chamber 10, the gas from the processing gas supply source 66 is switched to a processing gas containing, e.g., $N_2$, $O_2$, and/or fluorocarbon gas to perform the trimming process. In the trimming process, the resist pattern 102 is etched as shown in FIG. 3C such that its width becomes L1 that is narrower than L0 obtained in the process of modifying and enhancing the resist pattern 102. Accordingly, it is possible to provide the resist pattern 102 that is finer than that after completing the photolithography process. In the trimming process, only the photo resist 102 may be etched or, in addition, the film 101 may be etched in a pattern width after the trimming.

The trimming process is not limited to have a certain specific condition and can be performed under a typical trimming condition. Further, DC voltage may or may not be supplied from the variable DC power supply 50 will be omitted.

As such, in the present embodiment, the modifying process is performed first on the resist pattern 102 to form the modified layer 102a and then the trimming process is performed. Accordingly, it is possible to prevent the pattern collapse. Further, since plasma resistance is improved by the modified layer 102a, it is possible to decrease a vertically etched amount. Moreover, since the trimming process and the process of modifying and enhancing a resist pattern are performed in the same chamber, it is possible to more efficiently perform the processes.

Next, an experiment result of actually performing the process of modifying and enhancing a resist pattern will be described.

In the present embodiment, the experiment was performed by employing the plasma etching apparatus shown in FIG. 1, wherein the frequency of the first high frequency power supply 48 was 60 MHz; the frequency of the second high frequency power supply 90 was 13 MHz; and the processing gas was $CF_4$. As for samples, ArF resist blanket samples covering a whole surface of a 300 mm silicon wafer with an ArF resist were employed.

As basic conditions of the experiment, a pressure inside the chamber 10 was 100 mTorr (13.3 Pa); a power of the first high frequency power supply 48 (HF) was 1000 W; a power of the second high frequency power supply 90 (LF) was 30 W; a flow rate of $CF_4$ was 100 sccm (mL/min); and a processing time was 60 sec. As variable experimental conditions, no DC voltage was supplied for a sample No. 1; a DC voltage of −1500 V was supplied to the upper electrode 34 for a sample No. 2; and the DC voltage of −1500 V was supplied to the upper electrode 34 and one of the basic conditions was changed for samples Nos. 3 to 5. For the sample No. 3, HF was decreased to 200 W. For the sample No. 4, LF was increased to 250 W. For the sample No. 5, the pressure inside the chamber 10 was decreased to 10 mTorr (1.33 Pa). The experimental conditions are listed in the following table 1.

TABLE 1

| Sample | Pressure [mTorr] | HF[W] | LF[W] | DC Voltage [V] | Processing gas |
|---|---|---|---|---|---|
| No. 1 | 100 | 1000 | 30 | 0 | $CF_4$ |
| No. 2 | 100 | 1000 | 30 | −1500 | $CF_4$ |
| No. 3 | 100 | 200 | 30 | −1500 | $CF_4$ |
| No. 4 | 100 | 1000 | 250 | −1500 | $CF_4$ |
| No. 5 | 10 | 1000 | 30 | −1500 | $CF_4$ |

In the experimental conditions, a DC current (DCI), a plasma potential (LF Vpp) of LF, a self bias potential (HF Vdc) of HF, and a plasma potential (HF Vpp) of HF are listed in the following table 2.

TABLE 2

| Samples | DCI [A] | LF Vpp [V] | HF Vdc [V] | HF Vpp [V] |
|---|---|---|---|---|
| No. 1 | 0 | 70 | −80 | 3656 |
| No. 2 | 1.49 | 6 | −1495 | 4961 |
| No. 3 | 1.31 | 13 | −1495 | 1008 |
| No. 4 | 1.90 | 95 | −1495 | 5211 |
| No. 5 | 0.80 | 62 | −1495 | 8296 |

Figure 5:
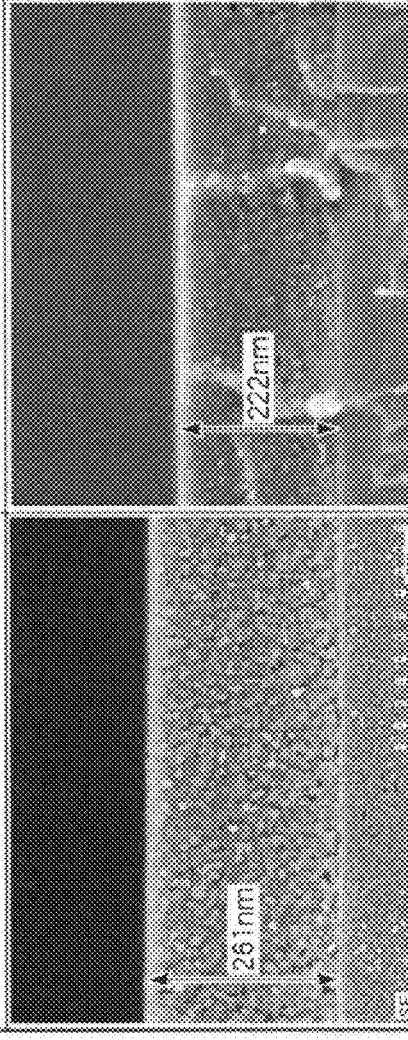
FIG. 5 is photographs taken with a scanning electron microscope showing cross sections of samples No. 1 to No. 5 in a film-thickness direction as compared with a state of an ArF resist layer of an initial sample.

FIG. 5 shows photographs taken with a scanning electron microscope showing cross sections of respective ArF resist layers in a film-thickness direction for untreated sample (an initial sample) and the sample Nos. 1 to 5 processed under the above experimental conditions. As shown in the photographs of FIG. 5, under the condition of No. 1 where no DC voltage was supplied, the ArF resist layer remained to be a single layer and no modified layer was formed, as in the initial sample. In contrast, the samples Nos. 2 to 5, all the ArF resist layers became a double layer and modified layers were formed on surfaces, respectively.

Ratios of the modified layers on the surfaces to respective bottom portions in which no modified layers were formed were 1.2 in the sample No. 2 and where the basic conditions were unchanged; 0.8 and 1.1 under the samples Nos. 3 and 4 in which the powers of HF and LF were changed. However, the ratio of the modified layer was greatly increased up to 2.4 in the sample No. 5 where the pressure inside the chamber 10 was decreased by 1/10.

Figure 6:
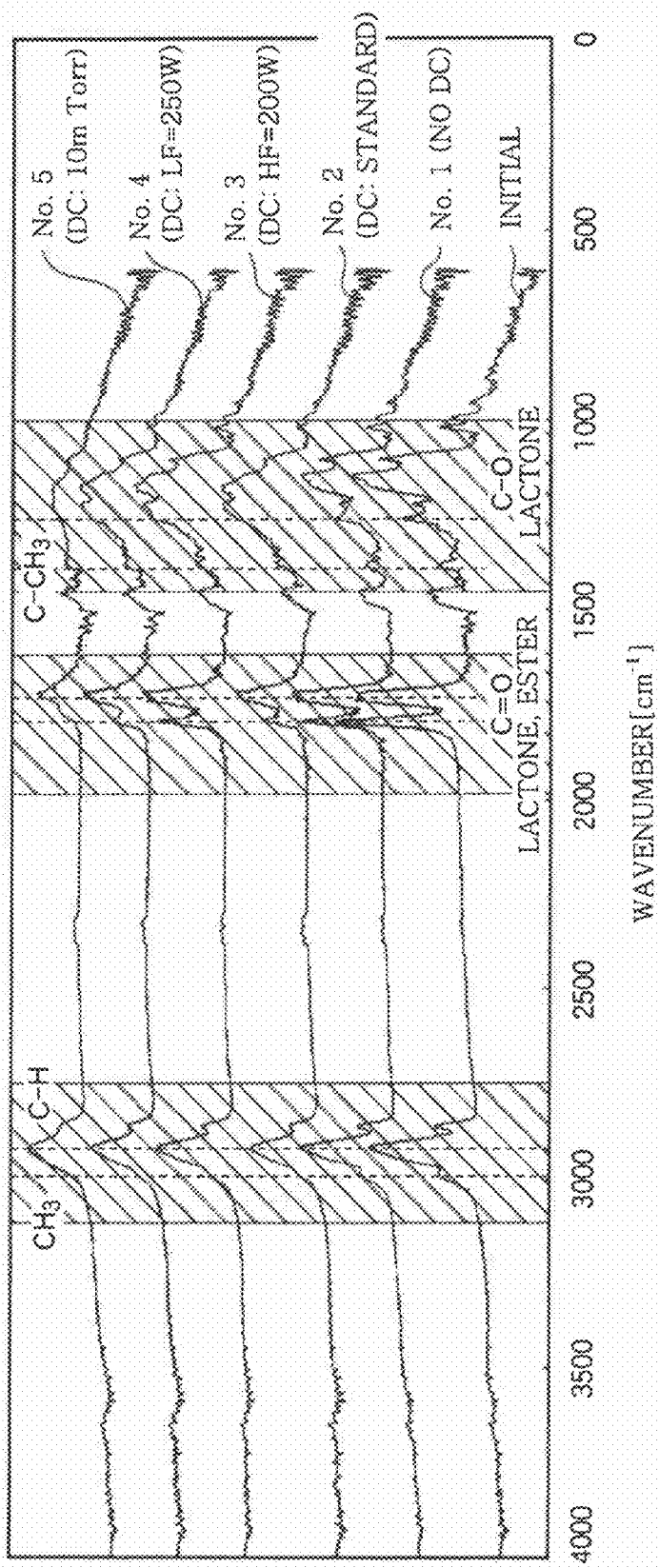
FIG. 6 is a graph showing spectrums of respective samples, when a Fourier transform infra-red (FTIR) spectrometry is performed on each sample by a transmission method.
Figure 7:
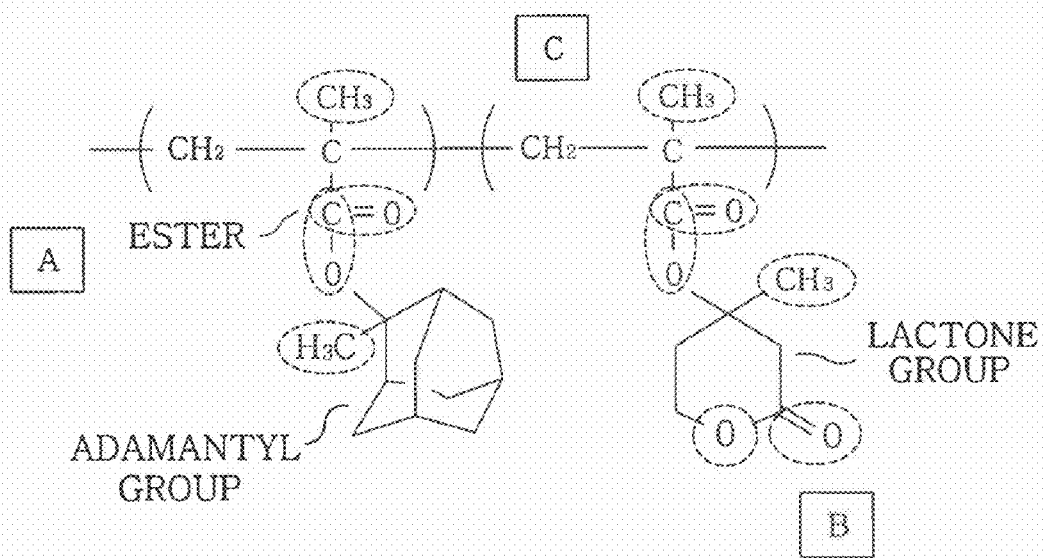
FIG. 7 is a view showing a basic structure and a structure change of an ArF resist.
Figure 8A:
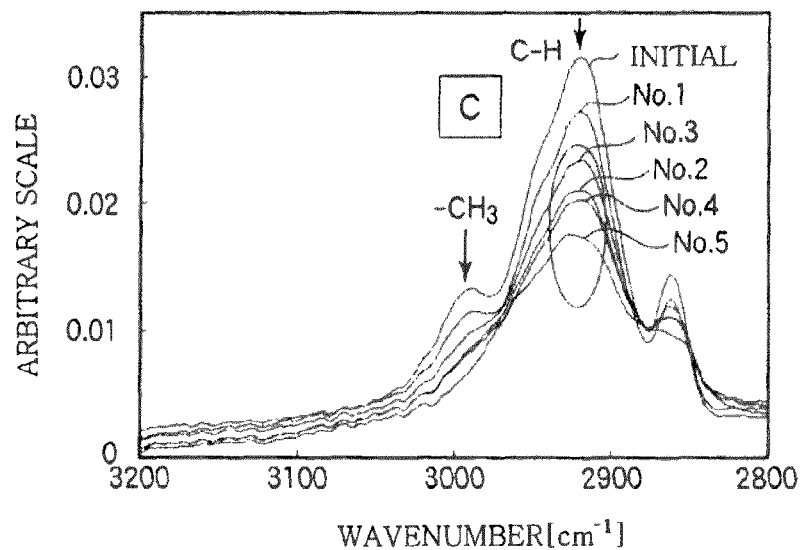
FIGS. 8A to 8C are expanded views showing respective peak regions in the spectral spectrum in FIG. 6.
Figure 8B:
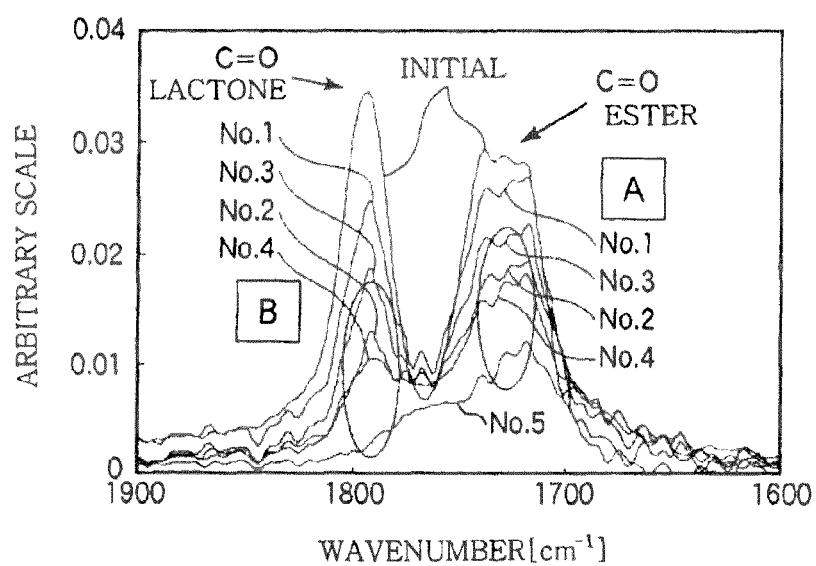
Figure 8C:
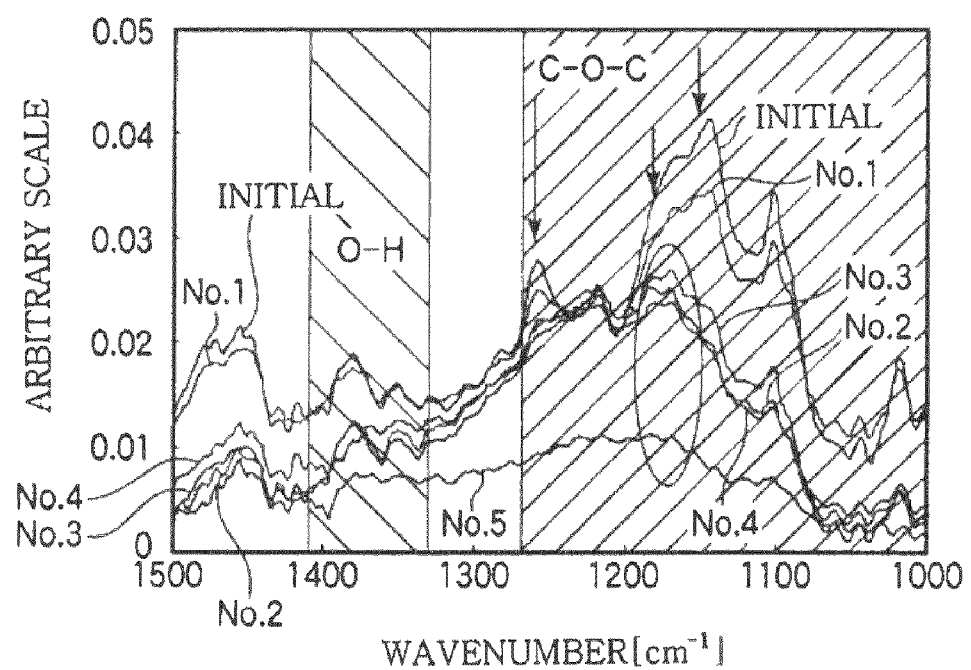
Figure 9A:
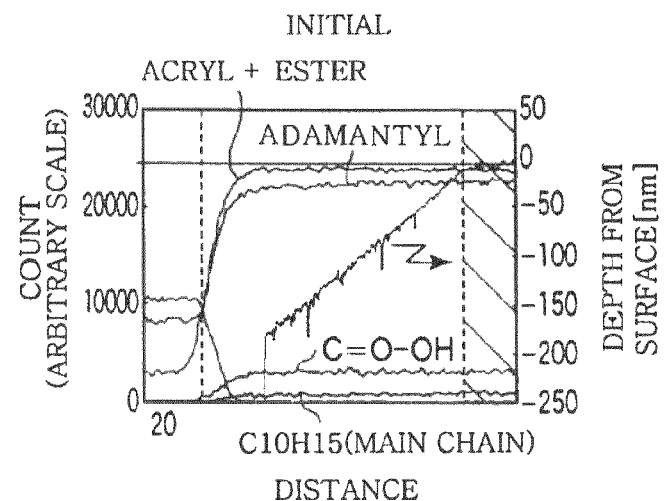
FIGS. 9A to 9F show SIMS profiles in a cutting direction for the initial sample and the samples No. 1 to No. 5.
Figure 9B:
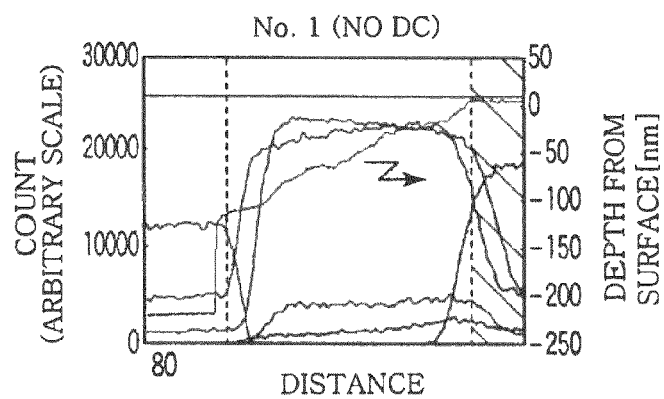
Figure 9C:
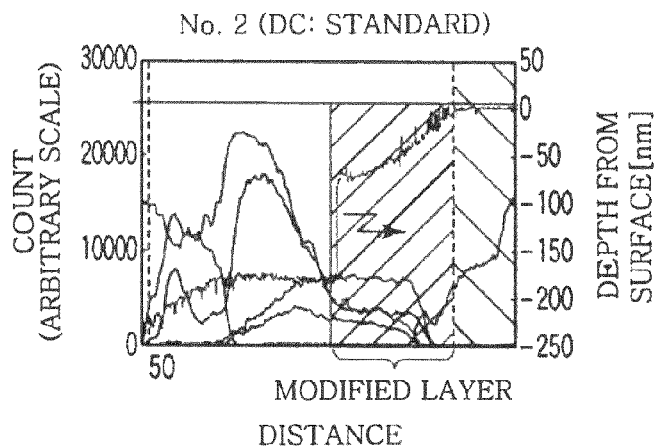
Figure 9D:
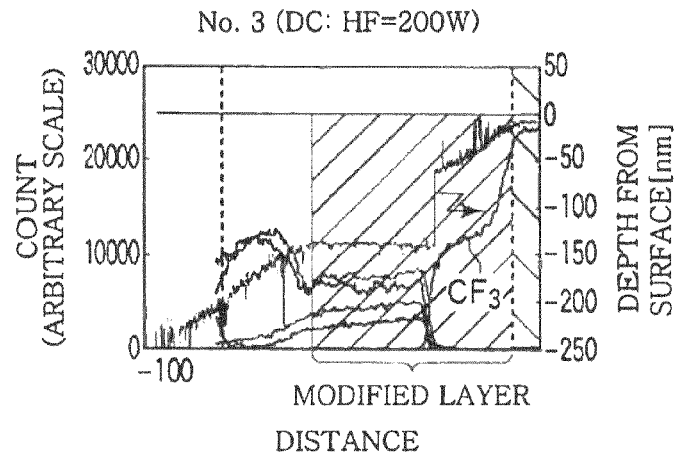
Figure 9E:
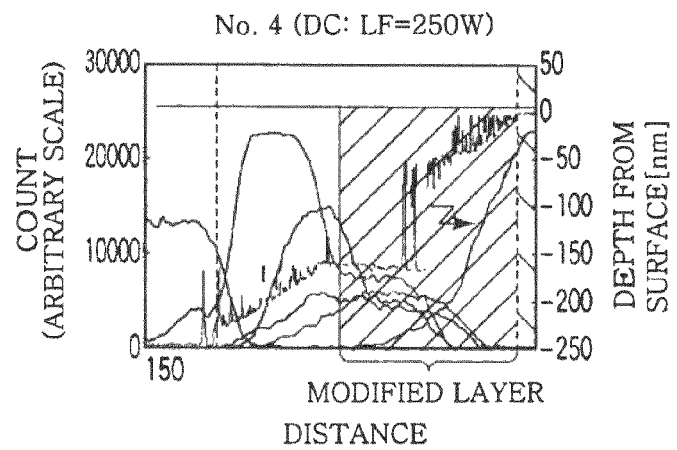
Figure 9F:
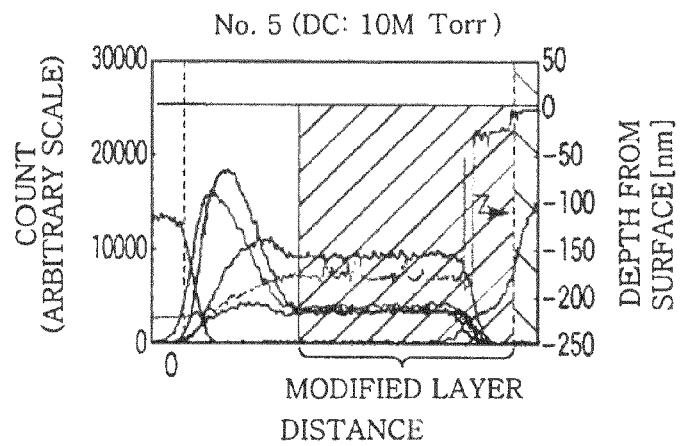

Next, a Fourier transform infra-red (FTIR) spectrometry was performed on each of the initial sample and the samples Nos. 1 to 5 by a transmission method. Spectrums of the respective samples thus obtained are shown in FIG. 6. The basic structure of the ArF resist is shown in FIG. 7. Shown in the spectrums of FIG. 6 are peaks of C=O of ester of main chain (represented as A in FIG. 7); C=O of a Lactone group (represented as B in FIG. 7); $CH_3$ and CH of various parts of main chain connection, a Lactone group, and an Adamanthyl group (represented as C in FIG. 7); C—O of various parts; and the like, peaks are shown. FIGS. 8A to 8C are enlarged views showing respective peak regions shown in FIG. 6. In detail, FIG. 8A shows peaks of $CH_3$ and CH in various parts represented as C in FIG. 7; FIG. 8B shows peaks of C=O of ester of main chain connection represented as A in FIG. 7, and C=O of the Lactone group represented as B in FIG. 7; and FIG. 8C shows peaks of C—O of various parts. FIG. 6 shows the separated spectrums of respective samples, while FIG. 8 shows the overlapped spectrums of respective samples.

As shown in FIGS. 6 to 8C, the peaks of C=O of the Lactone group, C=O of ester of main chain connection, $CH_3$, CH, and C—O of various parts were decreased by supplying the DC voltages. Specifically, the peak of C=O was significantly decreased. Moreover, FTIR spectrometry performed by the transmission method reflects a bulk state. Accordingly, it is confirmed that that the resist film were changed both in the surface and the bulk region.

A time-of-flight secondary ion mass spectrometry (TOF-SIMS) was performed by cutting the initial sample and the samples Nos. 1 to 5 obliquely in a thickness direction. FIGS. 9A to 9F shows SIMS profiles in a cutting direction. As shown in the SIMS profiles of FIGS. 9A to 9F, spectrums of (acryl+ester) parts and adamantyl group of a ArF resist in the initial sample were decreased in the modified layer formed by supplying the DC voltages and single-body ester and $C_{10}H_{15}$ where a skeleton of the main chain was collapsed, were increased. This indicates that restructuring of the skeleton of the main chain was promoted.

Figure 10:
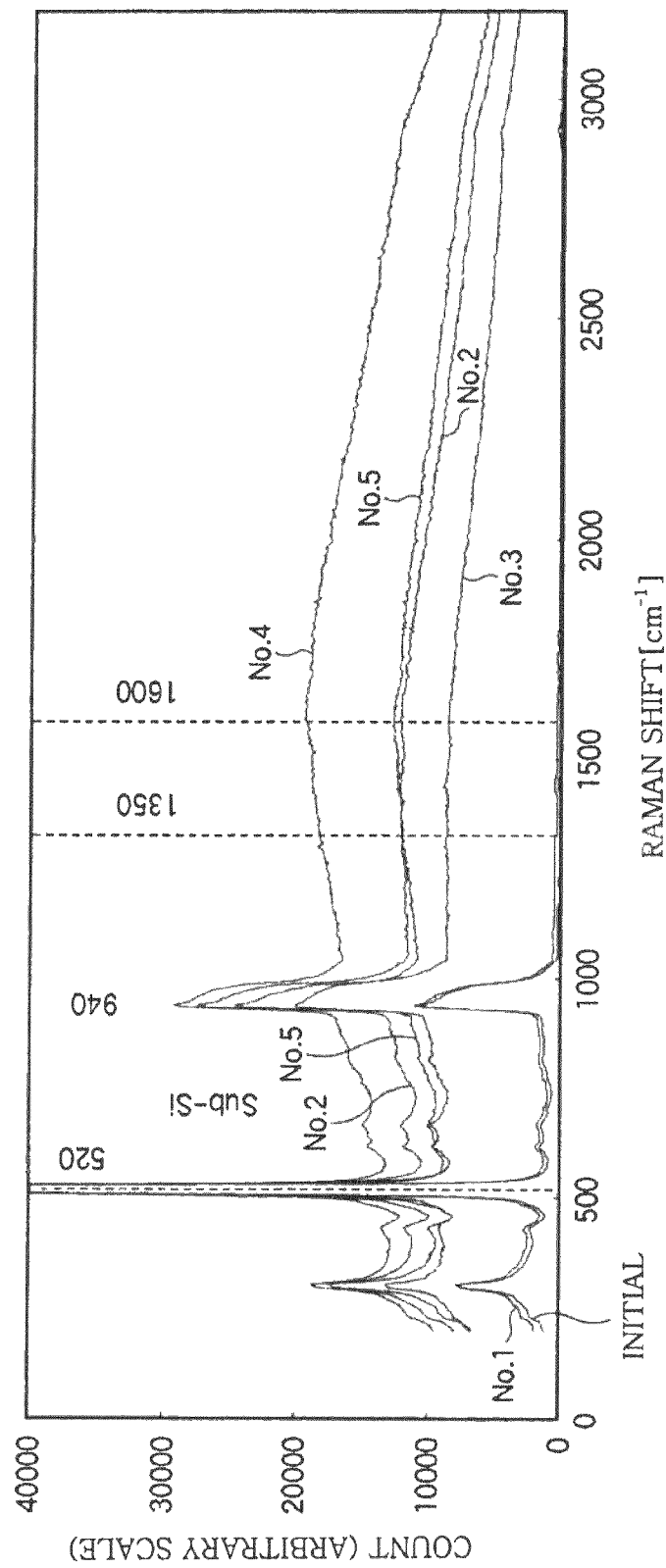
FIG. 10 is a graph showing Raman spectrums of the initial sample and the samples No. 1 to No. 5.

Next, a Raman spectrometry analysis was performed on the initial sample and the samples Nos. 1 to 5. The pertinent Raman spectrums are shown in FIG. 10. As shown in FIG. 10, it can be seen that by supplying the DC voltages, backgrounds of the Raman spectrums and a structure of the resist were significantly changed. However, there was no diamond like carbon (DLC) from which a Raman shift has peaks at regions of about 1350 and 1600 $cm^{31\ 1}$. Accordingly, it has been confirmed that even if the structure of the resist was greatly changed, the restructuring was not significant enough to produce DLC by a cross linking reaction.

As a result, it is confirmed that by supplying a negative DC voltage to the upper electrode of the etching apparatus, it is possible to promote the restructuring of the ArF resist and to form the modified layer having a stronger structure.

The present invention is not limited to the embodiments described above and various modifications can be made. For example, in the above described embodiment, the resist pattern is formed of the ArF resist. However, the present invention is not limited to the ArF resist. It is possible to employ other resists. Moreover, in the embodiment, the resist pattern is modified and then the trimming process is performed in the same apparatus (chamber). However, the trimming process may be performed in different apparatuses.

Figure 11:
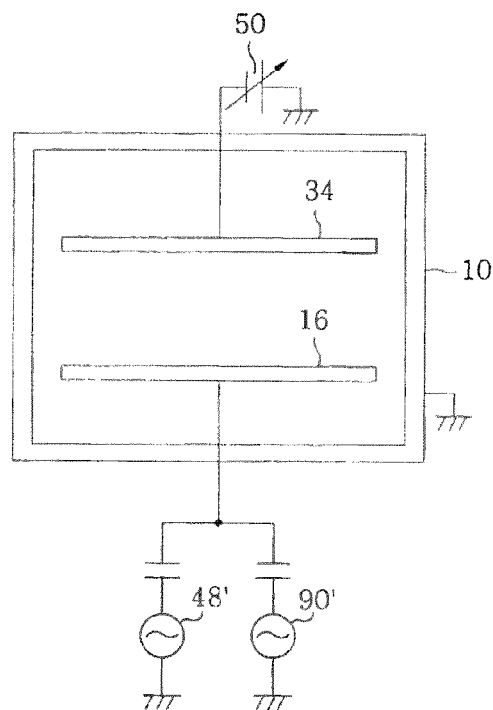
FIG. 11 schematically shows another example of a plasma etching apparatus.

The embodiment of the invention may be carried out in other apparatus than the plasma etching apparatus shown in FIG. 1. It is possible to employ, e.g., a lower electrode dual frequency application type plasma etching apparatus shown in FIG. 11, wherein a high frequency power of, e.g., 60 MHz for generating plasma and a high frequency power of, e.g., 13 MHz for attracting ions are respectively supplied from a first and a second high frequency power supply 48' and 90' to the lower electrode, i.e., the susceptor 16. Moreover, as shown in FIG. 11, the variable DC power supply 50 may be connected to the upper electrode 34 to supply a predetermined DC voltage thereto, thereby obtain the same effect as in the above embodiment.

Figure 12:
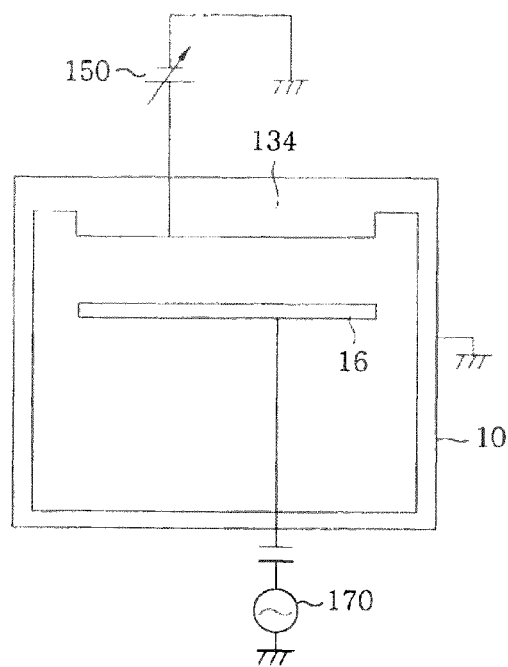
FIG. 12 schematically shows yet another example of a plasma etching apparatus.

Further, as shown in FIG. 12, it is possible to employ another type etching apparatus in which a high frequency power supply 170 is connected to the lower electrode, i.e., the susceptor 16, to supply a high frequency power for generating plasma thereto and a variable DC power supply 150 is connected to the upper electrode 34 to supply a predetermined DC voltage thereto.

In accordance with the embodiment of the present invention, before a trimming process of a resist pattern, in a parallel plate type plasma processing apparatus, since a target substrate is processed while supplying a negative DC voltage to an upper electrode, electrons around the upper electrode is vertically accelerated downward by the negative DC voltage supplied to the upper electrode and injected into the resist pattern formed on the target substrate. Accordingly, a portion injected with the electrons in the resist pattern is modified, thereby enhancing the resist pattern. Therefore, in the following trimming process, the pattern can be prevented from being collapsed. Moreover, since plasma resistance is improved by modifying the resist pattern, it is possible to decrease a vertically etched amount.

While the invention has been shown and described with respect to the embodiments, it will be understood by those skilled in the art that various changes and modification may be made without departing from the scope of the invention as defined in the following claims.

What is claimed is:

1. A plasma processing method for use with a plasma processing apparatus, which includes: a processing chamber configured to accommodate a target substrate therein and capable of exhausting its inside to vacuum; a lower electrode arranged in the processing chamber and serving as a mounting table for the substrate; an upper electrode arranged in the processing chamber to face the lower electrode; a processing gas supply unit configured to supply a processing gas to the inside of the processing chamber; a high frequency power supply configured to supply a high frequency power to at least one of the upper electrode and the lower electrode to generate a plasma; and a DC power supply configured to supply a negative DC voltage to the upper electrode, the method comprising:

modifying a resist pattern of the substrate; and
trimming the modified resist pattern through a plasma etching,
wherein said modifying includes:
supplying the processing gas for modification from the processing gas supply unit to the inside of the processing chamber while the substrate having a surface on which the resist pattern is formed is mounted on the lower electrode;

supplying the high frequency power from the high frequency power supply to generate a plasma of the processing gas for modification;

supplying the negative DC voltage from the DC power supply to the upper electrode; and controlling the negative DC voltage to the upper electrode to control a depth the resist pattern is modified.

2. The method of claim 1, wherein said trimming and said modifying are carried out in the plasma processing apparatus.

3. The method of claim 2, wherein said trimming of the modified resist pattern includes, after said modifying: supplying a processing gas for trimming from the processing gas supply unit to the inside of the processing chamber while the target substrate is mounted in the lower electrode; supplying a high frequency power from the high frequency power supply to generate a plasma of the processing gas for trimming; and etching the resist pattern by use of the plasma of the gas for trimming.

4. The method of claim 1, wherein the processing gas for modification includes a fluorocarbon gas.

5. The method of claim 4, wherein the fluorocarbon gas is $CF_4$.

6. The method of claim 1, wherein, in said modifying of the resist pattern, the voltage supplied from the DC power supply has a value less than 0 V and not less than −1500 V.

7. The method of claim 1, wherein the resist pattern is made of an ArF resist.

8. The method of claim 1, wherein a modified layer is formed on the surface of the resist pattern by said modifying the resist pattern and a thickness of the modified layer is thicker than depth of the modified layer etched by said trimming of the modified resist pattern.

9. The method of claim 1, wherein the step of controlling the negative DC voltage to the upper electrode step includes adjusting the negative DC voltage between a range of 0 and —2000 V to control the depth the resist pattern is modified.

10. The method of claim 1, wherein a larger magnitude of negative DC voltage to the upper electrode modifies a deeper depth of the resist pattern.

11. The method of claim 1, wherein during the trimming step a width of the resist pattern is narrowed such that a width of the resist pattern is smaller after trimming.

12. The method of claim 11, wherein at least a portion of the modified resist pattern remains covering the resist pattern after said trimming.

13. A resist pattern modifying method for use with a plasma processing apparatus, which includes: a processing chamber configured to accommodate a target substrate therein and capable of exhausting its inside to vacuum; a lower electrode arranged in the processing chamber and serving as a mounting table for the substrate; an upper electrode arranged in the processing chamber to face the lower electrode; a processing gas supply unit configured to supply a processing gas to the inside of the processing chamber; a high frequency power supply configured to supply a high frequency power to at least one of the upper electrode and the lower electrode to generate a plasma; and a DC power supply configured to supply a negative DC voltage to the upper electrode, the method comprising modifying a resist pattern of the substrate to form a modified resist pattern, wherein said modifying is carried out prior to trimming the resist pattern through a plasma etching, trimming the resist pattern to form a trimmed resist pattern by plasma etching;

wherein the resist pattern includes a top and at least two sides, including a first side and a second side, wherein the modified resist pattern includes a first width measured from an edge of the first side to an edge of the second side, wherein the trimmed resist pattern includes a second width measured from an edge of the first side to an edge of the second side, and wherein the second width is smaller than the first width such that the trimmed resist pattern is narrower than the modified resist pattern wherein said modifying includes:

supplying the processing gas for modification from the processing gas supply unit to the inside of the processing chamber while the substrate having a surface on which the resist pattern is formed is mounted on the lower electrode;

supplying the high frequency power from the high frequency power supply to generate a plasma of the processing gas for modification; and supplying the negative DC voltage from the DC power supply to the upper electrode;

and controlling the negative DC voltage to the upper electrode to control a depth the resist pattern is modified.

14. The method of claim 13, wherein the processing gas for modification includes a fluorocarbon gas.

15. The method of claim 14, wherein the fluorocarbon gas is $CF_4$.

16. The method of claim 13, wherein, in said modifying of the resist pattern, the voltage supplied from the DC power supply has a value less than 0 V and not less than −1500 V.

17. The method of claim 13, wherein the resist pattern is made of an ArF resist.

18. The method of claim 13, wherein a modified layer is formed on the surface of the resist pattern by said modifying the resist pattern and a thickness of the modified layer is thicker than depth of the modified layer etched by said trimming of the modified resist pattern.

19. The method as recited in claim 13, wherein the modifying of the resist pattern includes modifying of top and side portions of the resist pattern such that an entire perimeter of the resist is modified.

* * * * *